(12) United States Patent
Zhou

(10) Patent No.: US 8,675,698 B2  
(45) Date of Patent: Mar. 18, 2014

(54) GREEN LASER SYSTEM

(75) Inventor: Deyu Zhou, Marlboro, NJ (US)

(73) Assignee: Opnext, Inc., Eatontown, NJ (US)

( * ) Notice: Subject to any disclaimer, the term of this patent is extended or adjusted under 35 U.S.C. 154(b) by 476 days.

(21) Appl. No.: 12/046,838

(22) Filed: Mar. 12, 2008

(65) Prior Publication Data

US 2009/0232168 A1 Sep. 17, 2009

(51) Int. Cl.
*H01S 3/10* (2006.01)

(52) U.S. Cl.
USPC ............................... 372/22; 372/21

(58) Field of Classification Search
CPC ............................... H01S 5/0287; H01S 3/109
USPC ....................................... 372/21, 22
See application file for complete search history.

(56) References Cited

U.S. PATENT DOCUMENTS

| | | | | |
|---|---|---|---|---|
| 7,447,243 | B2 * | 11/2008 | Aoshima et al. | 372/21 |
| RE43,421 | E * | 5/2012 | Zhang | 372/22 |
| 2007/0230532 | A1 * | 10/2007 | Copner et al. | 372/92 |
| 2008/0079855 | A1 * | 4/2008 | Komatsu et al. | 348/759 |
| 2009/0010001 | A1 * | 1/2009 | Kamijima et al. | 362/259 |

* cited by examiner

*Primary Examiner* — Tod T Van Roy
(74) *Attorney, Agent, or Firm* — Fenwick & West LLP

(57) ABSTRACT

A green laser is made by constructing a laser cavity that includes within it a laser diode, a non-linear crystal such as KTP, and a lens. The boundaries of the cavity are not defined by the ends of the diode itself, but are instead defined by the ends of an apparatus that includes the lens and the KTP or similar crystal.

8 Claims, 3 Drawing Sheets

GREEN LASER SYSTEM

TECHNICAL FIELD

This invention relates to lasers, and more specifically, to an improved green laser for use in both commercial and military applications.

BACKGROUND OF THE INVENTION

Green lasers are advantageous over more widely used red lasers for a variety of reasons. Green lasers are easier on the human eye, more perceptible to a user, and more capable of providing clearer, projected images for users.

Most green lasers, a prior art example of which is shown in FIG. 1, suffer from a variety of drawbacks. First, power efficiency is relatively low, typically about 7% or less. Second, such lasers are only operable among very limited temperature ranges. Additionally, modulation speed is very limited. Other potential drawbacks of present green laser technologies include heat, cost and package size.

FIG. 2 shows a typical structure for a prior art green laser diode. A lens 202 is positioned in front of a laser diode 201 with so that the laser diode 201 excites a crystal to emit light at 1064 nanometers. The 1064 nanometer light is used to excite a nonlinear crystal such as KTP crystal, to generate second harmonic wave at 532 nanometers. This green laser light is then processed through beam expansion optics 205 as shown in FIG. 2. This prior arrangement suffers from several of the above described problems, including increased heat generation and package size.

An additional prior art green laser arrangement is shown in FIG. 3. A 1064 nanometer laser diode is arranged so that its output is processed through lenses 302 and focused on a PPMgLN crystal waveguides on a temperature controlled plate. The output from the nonlinear optical waveguide is processed through a collimating lens and color-filter 305, resulting in a green laser output beam via single pass second harmonic generation.

The arrangement shown in FIG. 3 is also subject to certain drawbacks. For example, there is a narrow temperature range over which such a device can operate, after which performance and power drastically degrade. Moreover, there are a large number of parts as shown in FIG. 3, some of which can be expensive. Further, in order to obtain sufficient power conversion efficiency, it is critical that all of the components be aligned properly, resulting in a complex and expensive manufacturing process, that utilizes many expensive parts.

There exists a need in the art for a more efficient and cost effective technology for producing green lasers.

DETAILED DESCRIPTION OF THE PREFERRED EMBODIMENT

In accordance with an embodiment of the present invention, a laser diode is positioned within a cavity that includes a non-linear optical crystal. The cavity that causes the lasing is positioned between rear side of the actual laser diode, and front side of a non-linear crystal. The arrangement permits the generation of a green light laser beam with an easier manufacturing technique. The method is extendable to other color lasers.

Figure 1:
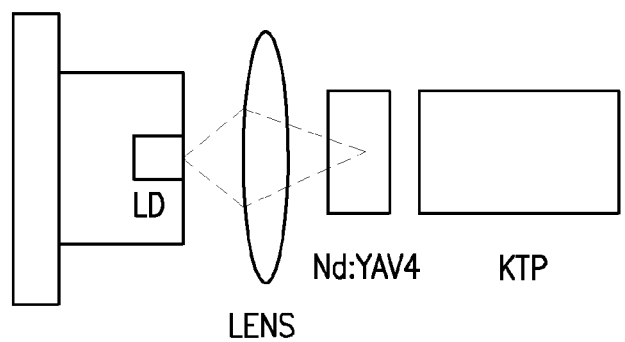
FIG. 1 is a block diagram of a prior art arrangement for generating green laser light.
Figure 2:
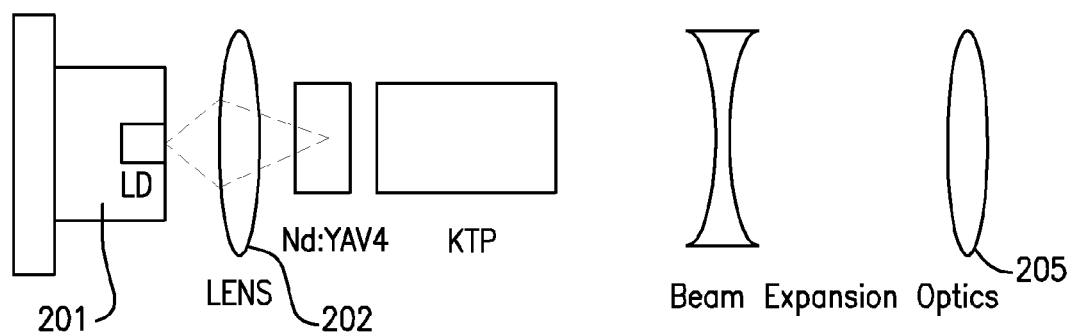
FIG. 2 is a block diagram some further details of the prior art arrangement of FIG. 1.
Figure 3:
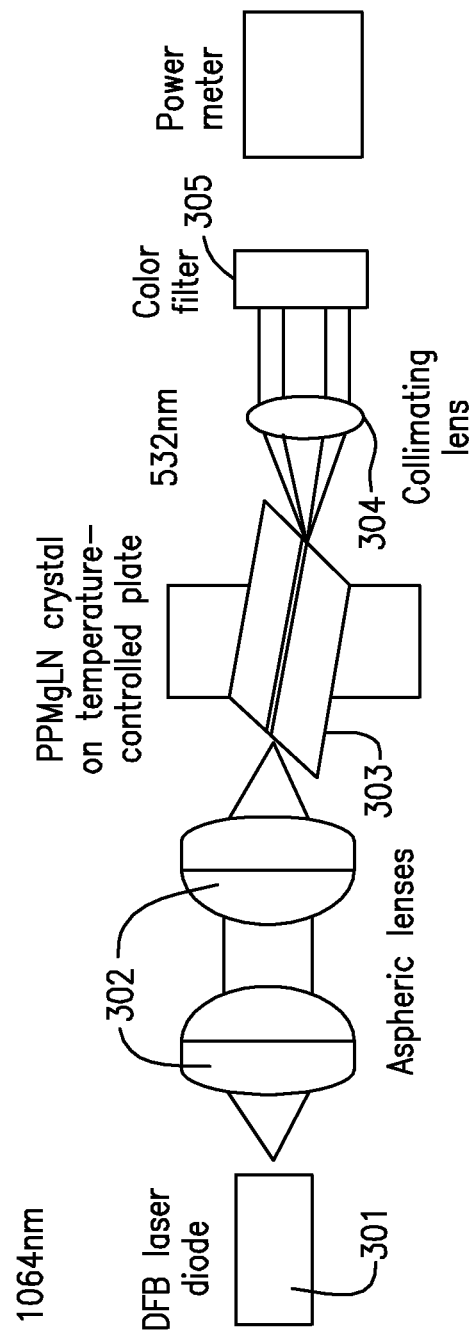
FIG. 3 depicts another green laser system of the prior art.
Figure 4:
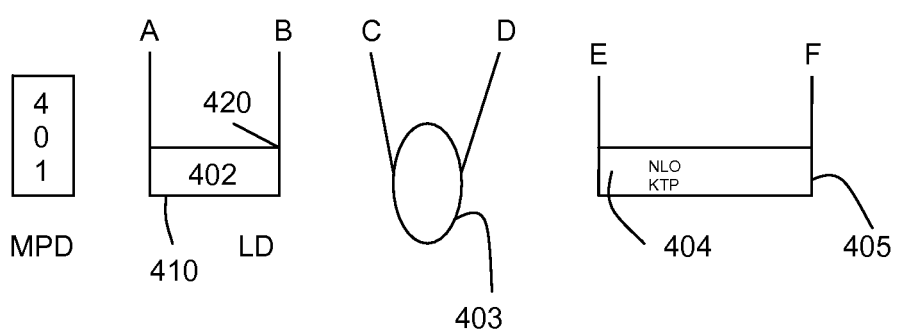
FIG. 4 shows a conceptual diagram of a green laser system in accordance with the present invention.

Shown at FIG. 4 is a monitor photodiode 401 to the left of a laser diode 402. An optional lens 403 is depicted to focus the light from the laser diode 402 onto a non-linear optical crystal 404. The surfaces labeled A-F are properly selected to form a cavity that causes the green laser light. Specifically, surface A is high reflectivity at both the first and second harmonics of interest. A monitoring photodiode 401 is positioned to the left of the diode 402, as shown. The monitoring photodiode detects a small amount of light from the diode 402, and uses such detected light for diagnostic and control purposes such as automatic power control.

The surface at exhibit B is anti-reflection (AR) coated at both the fundamental and second harmonic wavelengths which simply permits the passage of light. Unlike a conventional laser, the surface of exhibit B is not set up to be partially reflective and cause the lasing because the space between surfaces A and B do not act as the laser cavity as in conventional products. The diode 402 is the gain media in this intra-cavity laser and second harmonic generation device.

A lens 403 is AR coated at both the fundamental and second harmonic wavelengths and focuses the output light on a non-linear optical crystal which produces the green light. The exact green laser wavelength is determined by laser gain media and corresponding cavity design. For the gain media with cavity that produce fundamental wavelength from 1040 nanometer to 1064 nanometer; the second harmonic wave produces green laser beam light from 520 nanometer to 532 nanometer. The crystal 404 may be a non-linear optical (NLO) crystal such as KTP (Potassium Titanyl Phosphate KTiOPO), although other such crystals may be used as well.

A surface E shown at FIG. 4 is antireflective ("AR") coated at both the fundamental and second harmonic wavelength. Light energy passes through that coating and through nonlinear optical crystal 404, and encounters the surface 405 labeled F, which, together with surface 410 labeled A, form the laser cavity within which the light wave resonated before exiting. Surface F is high reflection (HR) coated at the fundamental wavelength and partially-transmission coated to output laser light energy at the second harmonic wavelength.

In operation, light emanates from the surface F at the second harmonic laser wavelength. Additionally, residual energy emanates at the fundamental laser wavelength because the high reflective coating at the fundamental wavelength is not one hundred percent reflective. Assuming the laser diode has its peak gain at 1040 nanometer to 1064 nanometer, the second harmonic output is in the visual green range, 520 nanometer and 532 nanometer.

Prior art arrangements typically include a either a pump laser to generate the fundamental wavelength at infra-red (IR), such as 1064 nanometer, or an IR pump laser such as a DBR laser 1064 nanometer to generate green in a single pass, second harmonic generation. However, various embodiments of the present invention actually encapsulate the non-linear optical crystal within the cavity, and also include an optional lens 403, depending upon the balance of cost and electro-optical efficiency requirements. Also, the present invention includes a semiconductor diode 402 within the cavity in between surfaces A and F of FIG. 4 and the diode provides optical gain. The optical oscillation wave within the cavity that sets up the laser beam has its endpoints at surfaces 410 and 405 (A and F).

The preferred laser diode 402 is in the near infra-red range, say 1040-1064 nanometer, in order to generate green although this is not critical to the present invention. If the gain of the laser diode and its corresponding HR coating are properly chosen to be near 920 nanometers, the invention can be applied to generate blue laser output. Other wavelengths may be used as well. By using such a laser diode 402, electro-optical power conversion efficiency of about 20-25 percent can be achieved at the second harmonic wavelength, such percentage being measured as the fraction of input electrical power that appears as output light power at the second harmonic wavelength.

In addition to nonlinear crystal KTP, it has been found that other crystals such as GdCa4O(BO3)3, GdxY1-xCa4O (BO3)3 may also be used for wider temperature operation.

The length of the laser cavity, especially the length the nonlinear optical crystal is determined by the optimal conversion efficiency and power requirements. Additionally, the coatings for each of the surfaces indicated in FIG. 4 as A, B, C, D E and F may be as follows, with each representing an example only: Surface A, HR coating for both fundamental ($\omega$) and second harmonic waves ($2\omega$), Surface B through E, AR coating for $\omega$ and $2\omega$ waves and surface F, HR coating at ($\omega$) and partial transmission coating at $2\omega$ waves.

The laser may be any type including of near IR wavelength. As is known in the art, near IR is above about 700 nm to below about 2000 nm.

Output filter 406 could be mounted inside a package housing and HR coated at surface G fundamental wavelength to rid of residual fundamental laser output from the laser cavity and AR coated the surface G at second harmonic wavelength. Surface H of the filter 406 can be AR coated for both fundamental and second harmonic wavelength. Alternatively, monitor photodiode 401 can be placed sideways so that reflections from filter can be used to monitor laser output to avoid significant tracking error due to a laser output front and back emission power differences.

While the above describes the preferred embodiment of the present invention, various other embodiments will be apparent to those of skill in the art. The scope of the invention therefore, is defined by the following claims.

The invention claimed is:

1. A laser device having a monitoring diode disposed adjacent a laser diode having a first wavelength of emitted light, said laser diode being rearward of a lens, said lens being rearward of a non-linear crystal, said non-linear crystal emitting light forwardly at substantially half the first wavelength, said laser device including a laser cavity defined by a forward wall of said non-linear crystal, which is reflective at the first wavelength and partially transmissive at half the first wavelength and a rearward wall of said laser diode, which is reflective at both the first wavelength and half the first wavelength, the non-linear crystal positioned such that light emitted from a forward wall of said laser diode is incident on a rearward wall of the non-linear crystal.

2. The laser device of claim 1 wherein said first wavelength is near IR.

3. The laser device of claim 2 wherein the cavity wall defined by the forward wall of the non-linear crystal is coated to produce high reflection at a fundamental wavelength and partial reflection at a second harmonic wavelength.

4. A laser emitting device, comprising:
   a laser diode that emits light at a first wavelength, the laser diode comprising a first surface and a second surface, the first surface being highly reflective to light at the first wavelength and light at a second wavelength, the second surface being anti-reflection coated at both the first and second wavelengths; and
   a non-linear crystal comprising a third surface and a fourth surface, the non-linear crystal positioned such that light transmitted from the second surface is incident on the third surface, the third surface being anti-reflection coated at both the first and second wavelengths, the fourth surface being highly reflective to light at the first wavelength and partially transmissive to light at the second wavelength, the non-linear crystal converting a portion of the light at the first wavelength to light at the second wavelength.

5. The laser emitting device of claim 4, wherein the non-linear crystal comprises at least one of: of KTP, GdCa4O (BO3)3, or GdxY1-xCa4O(BO3)3.

6. The laser emitting device of claim 4, further comprising:
   a lens, positioned between the second surface and the third surface, configured to focus the light transmitted from the second surface on the third surface.

7. The laser emitting device of claim 6, wherein the lens is anti-reflection coated at both the first and second wavelengths.

8. The laser emitting device of claim 4, further comprising:
   a monitoring photodiode, positioned such that a small amount of light from the laser diode is incident on the photodiode.

\* \* \* \* \*